US012595544B2

(12) United States Patent
Ko et al.

(10) Patent No.: US 12,595,544 B2
(45) Date of Patent: Apr. 7, 2026

(54) DEPOSITION APPARATUS

(71) Applicant: Samsung Display Co., LTD., Yongin-si (KR)

(72) Inventors: Junhyeuk Ko, Yongin-si (KR); Mingoo Kang, Yongin-si (KR); Euigyu Kim, Yongin-si (KR); Jongbum Kim, Yongin-si (KR); Sukha Ryu, Yongin-si (KR); Sang Min Yi, Yongin-si (KR); Kyunghoon Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 462 days.

(21) Appl. No.: 18/218,485

(22) Filed: Jul. 5, 2023

(65) Prior Publication Data

US 2024/0068082 A1 Feb. 29, 2024

(30) Foreign Application Priority Data

Aug. 30, 2022 (KR) ........................ 10-2022-0109212

(51) Int. Cl.
*C23C 14/04* (2006.01)
*H10K 71/10* (2023.01)
*H01L 21/68* (2006.01)
*H10K 59/12* (2023.01)

(52) U.S. Cl.
CPC ......... *C23C 14/042* (2013.01); *H10K 71/191* (2023.02); *H01L 21/682* (2013.01); *H10K 59/1201* (2023.02)

(58) Field of Classification Search
None
See application file for complete search history.

(56) References Cited

U.S. PATENT DOCUMENTS

2008/0279442 A1   11/2008   Den et al.
2015/0011075 A1   1/2015   Han

FOREIGN PATENT DOCUMENTS

| JP | 2021161535 A | 10/2021 |
| JP | 2021178986 A | 11/2021 |
| KR | 1020110009486 A | 1/2011 |
| KR | 1020150070571 A | 6/2015 |
| KR | 102124426 B1 | 6/2020 |
| KR | 1020210049265 A | 5/2021 |
| KR | 1020210055600 A | 5/2021 |

OTHER PUBLICATIONS

Machine Translation of KR 10-20210049265.*

* cited by examiner

*Primary Examiner* — Christopher T Schatz
(74) *Attorney, Agent, or Firm* — CANTOR COLBURN LLP

(57) ABSTRACT

A deposition apparatus includes a mask, a mask frame, a stage disposed on a rear surface of the mask frame, and first to third external force applying parts disposed on the stage. Each of the first portion and the second portion includes a support and a driving part which moves the support. The first to third external force applying parts applies external force to the mask frame to control a shape of the mask frame.

20 Claims, 10 Drawing Sheets

DEPOSITION APPARATUS

This application claims priority to Korean Patent Application No. 10-2022-0109212, filed on Aug. 30, 2022, and all the benefits accruing therefrom under 35 U.S.C. § 119, the content of which in its entirety is herein incorporated by reference.

BACKGROUND

1. Field

The disclosure herein relates to a deposition apparatus, and more particularly, to a deposition apparatus used for manufacturing a display panel.

2. Description of the Related Art

Display devices such as televisions, mobile phones, tablet computers, navigators, game consoles, or the like include a display panel. The display panel may include a plurality of pixels. Each of the plurality of pixels may include a driving element such as a transistor and a display element such as an organic light-emitting diode. The display element may be formed by depositing an electrode and an emission pattern on a substrate.

The emission pattern may be patterned using a mask in which a deposition opening is defined to be formed in a predetermined area. Recently, to improve production yield of the display panel, a deposition process technology using a large-area mask is being developed.

SUMMARY

However, when the mask is not aligned at a desired position in the deposition apparatus, there is a limitation in that accuracy of the emission pattern formation position is deteriorated.

The disclosure provides a deposition apparatus capable of performing large-area deposition and having improved deposition accuracy.

An embodiment of the inventive concept provides a deposition apparatus including: a mask in which a plurality of deposition openings are defined; a mask frame which includes first to fourth portions and is disposed on a rear surface of the mask and in which an opening is defined; a stage disposed on a rear surface of the mask frame; and first to third external force applying parts disposed on the stage, wherein each of the first portion and the second portion extends in a first direction, and each of the third portion and the fourth portion extends in a second direction perpendicular to the first direction, the first external force applying part includes a first support which supports an outer surface of the first portion and a first driving part which moves the first support in the second direction, the second external force applying part includes a second support which supports an outer surface of the third portion and a second driving part which moves the second support in the first direction, and the third external force applying part includes a third support which supports an outer surface of the fourth portion and a third driving part which moves the third support in the first direction.

In an embodiment, the first external force applying part may include a plurality of first sub external force applying parts spaced apart from each other in the first direction, the second external force applying part may include a plurality of second external force applying parts spaced apart from each other in the second direction, and the third external force applying part may include a plurality of third sub external force applying parts spaced apart from each other in the second direction.

In an embodiment, each of the plurality of first sub external force applying parts may be independently movable in the second direction, each of the plurality of second sub external force applying parts may be independently movable in the first direction, and each of the plurality of third sub external force applying parts may be independently movable in the first direction.

In an embodiment, the plurality of second sub external force applying parts may be spaced apart from each other at one side of the third portion, which is adjacent to the first portion, and an opposite side of the third portion, which is adjacent to the second portion, and the plurality of third sub external force applying parts may be spaced apart from each other at one side of the fourth portion, which is adjacent to the first portion, and the opposite of the fourth portion, which is adjacent to the second portion.

In an embodiment, at least one of the first to third driving parts may include an electric motor or a piezoelectric element.

In an embodiment, the deposition apparatus may further include a chamber in which an inner space, in which the mask, the mask frame, the stage, and the first to third external force applying parts are disposed, is defined, and the first portion may be disposed face a bottom surface of the chamber.

In an embodiment, the deposition apparatus may further include a deposition member which faces a rear surface of the stage in the inner space and injects a deposition material onto the mask.

In an embodiment, each of the mask and the mask frame may include a metal.

In an embodiment of the inventive concept, a deposition apparatus includes: a chamber in which an inner space is defined; a stage which provides a seating surface that is perpendicular to a bottom surface of the chamber; a mask frame is disposed on the seating surface, and including a first portion, in which an opening is defined, and which extends in a first direction parallel to the bottom surface and is adjacent to the seating surface, a second portion facing the first portion and extending in the first direction, a third portion extending in a second direction parallel to the seating surface and disposed between the first portion and the second portion, and a fourth portion facing the third portion and extending in the second direction; a mask in which a deposition opening is defined and which overlaps the opening on the mask frame; and a first external force applying part including a first support which supports an outer surface of the first portion and a first driving part which moves the first support in the second direction.

In an embodiment, the first external force applying part may include a plurality of first sub external force applying parts spaced apart from each other in the first direction on the first portion.

In an embodiment, each of the plurality of first sub external force applying parts may be independently movable in the second direction.

In an embodiment, the first driving part may include an electric motor or a piezoelectric element.

In an embodiment, the deposition apparatus may further include: a second external force applying part disposed on an outer surface of the third portion and including a second support and a second driving part which moves the second support in the first direction; and a third external force applying part disposed on an outer surface of the fourth portion and including a third support and a third driving part which moves the third support in the first direction.

In an embodiment, the second external force applying part may include a plurality of second sub external force applying parts, and the third external force applying part may include a plurality of third sub external force applying parts.

In an embodiment, each of the plurality of second sub external force applying parts may be independently movable in the first direction, and each of the plurality of third sub external force applying parts may be independently movable in the first direction.

In an embodiment, the plurality of second sub external force applying parts and the plurality of third sub external force applying parts may one-to-one correspond to each other in the first direction.

In an embodiment, the plurality of second sub external force applying parts may be spaced apart from each other at one side of the third portion, which is adjacent to the first portion, and an opposite side of the third portion, which is adjacent to the second portion, and the plurality of third sub external force applying parts may be spaced apart from each other at one side of the fourth portion, which is adjacent to the first portion, and the opposite side of the fourth portion, which is adjacent to the second portion.

In an embodiment, each of the mask and the mask frame may include a metal.

In an embodiment, the deposition apparatus may further include a deposition member which faces a rear surface of the stage in the inner space and injects a deposition material onto the mask.

In an embodiment of the inventive concept, a deposition method includes: providing a stage providing a seating surface and first to third external force applying parts disposed on the stage; providing a mask frame including first to fourth portions on the seating surface and a mask which is coupled to the mask frame and in which deposition openings are defined; simulate a formation position of each of deposition patterns that respectively correspond to the deposition openings; and moving at least one of the first to third external force applying parts so that the formation position of each of the deposition patterns is disposed within a design range to adjust force applied to the mask frame, wherein each of the first portion and the second portion extends in a first direction, and each of the third portion and the fourth portion extends in a second direction perpendicular to the first direction, the first external force applying part includes a first support supporting an outer surface of the first portion and a first driving part moving the first support in the second direction, the second external force applying part includes a second support supporting an outer surface of the third portion and a second driving part moving the second support in the first direction, and the third external force applying part may include a third support supporting an outer surface of the fourth portion and a third driving part moving the third support in the first direction.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

DETAILED DESCRIPTION

Figure 1:
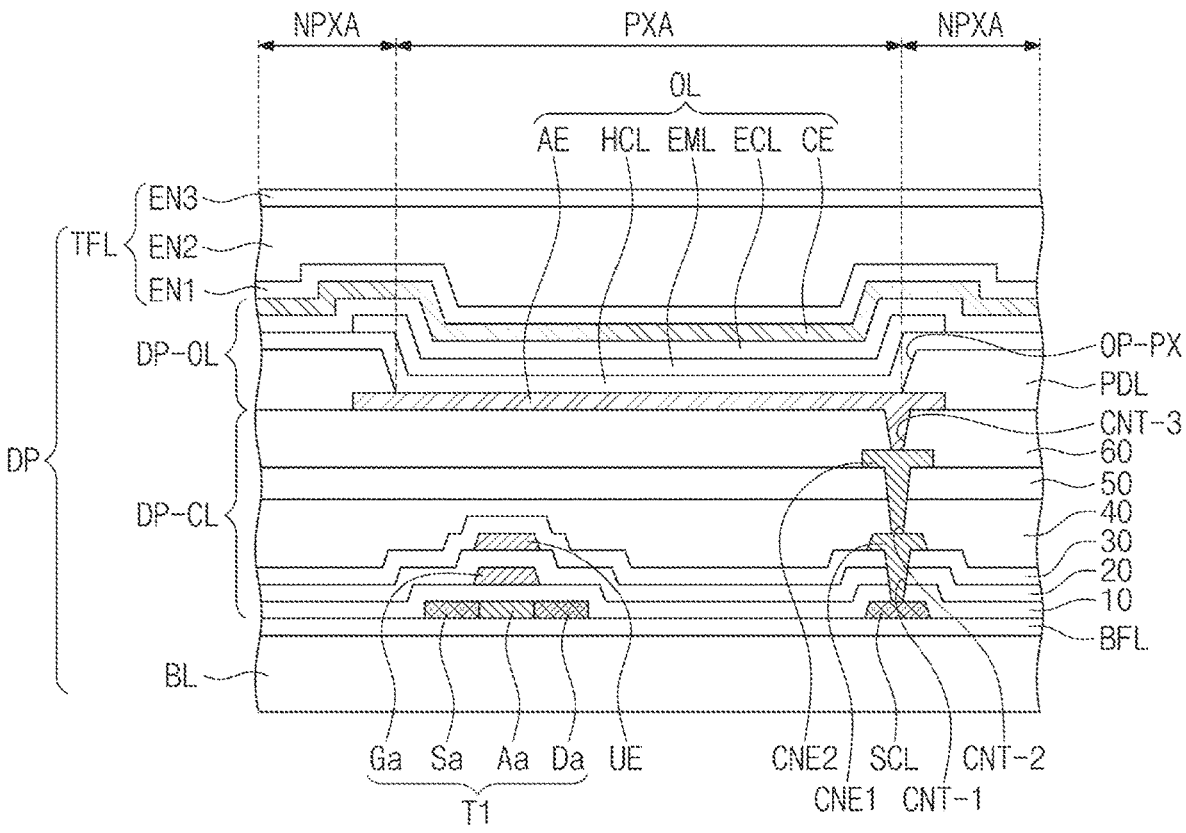
FIG. 1 is a cross-sectional view of an embodiment of a display panel.

Since the invention may have diverse modified embodiments, illustrative embodiments are illustrated in the drawings and are described in the detailed description of the invention. However, this does not limit the invention within illustrative embodiments and it should be understood that the invention covers all the modifications, equivalents, and replacements within the idea and technical scope of the invention.

In this specification, it will also be understood that when one component (or area, layer, portion) is referred to as being "on", "connected to", or "coupled to" another component, it can be directly disposed/connected/coupled on/to the one component, or an intervening third component may also be present.

In this specification, "directly disposed" may mean that there is no layer, film, area, plate, or the like between a portion of the layer, the layer, the area, the plate, or the like and the other portion. For example, "directly disposed" may mean being disposed without using an additional member such and an adhesion member between two layers or two members.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. These terms are used only to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings. In this specification, the term "disposed on" may refer to a case in which it is disposed on a lower portion as well as an upper portion of any one member.

Unless otherwise defined, all terms (including technical and scientific terms) used herein have the same meaning as commonly understood by a person of ordinary skill in the art to which this invention belongs. In addition, terms such as terms defined in commonly used dictionaries should be interpreted as having a meaning consistent with the meaning in the context of the related technology, and unless explicitly defined here, they are interpreted as too ideal or too formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, a deposition apparatus in an embodiment will be described with reference to the accompanying drawings.

FIG. 1 is a cross-sectional view of an embodiment of a display panel according to the inventive concept.

A deposition apparatus ED (refer to FIG. 2) in an embodiment to be described below may be used to form at least some of functional layers provided in a display panel DP. FIG. 1 illustrates a cross-section of the display panel DP manufactured by the deposition apparatus ED (refer to FIG. 2).

In an embodiment, the display panel DP may be an emission type display panel. In an embodiment, the display panel DP may be an organic light-emitting display panel, an inorganic light-emitting display panel, or a quantum dot light-emitting display panel, for example. An emission layer of the organic light-emitting display panel may include an organic light-emitting material, and an emission layer of the inorganic light-emitting display panel may include an inorganic light-emitting material. An emission layer of the quantum dot light-emitting display panel may include a quantum dot, a quantum rod, or the like. Hereinafter, the display panel DP is described as an organic light-emitting display panel.

The display panel DP may include a plurality of pixels. Each of the pixels may include at least one transistor and a light-emitting element. FIG. 1 illustrates an area on which one transistor T1 and one light-emitting element OL are disposed among the pixels of the display panel DP. Referring to FIG. 1, the display panel DP may include a base layer BL, a circuit element layer DP-CL, a display element layer DP-OL, and an encapsulation layer TFL.

The base layer BL may provide a base surface on which the circuit element layer DP-CL is disposed. The base layer BL may include a synthetic resin layer. After the synthetic resin layer is disposed on a support substrate used in manufacturing the display panel DP, a conductive layer and an insulating layer may be disposed on the synthetic resin layer. Thereafter, the support substrate may be removed, and the synthetic resin layer from which the support substrate is removed may correspond to the base layer BL.

At least one inorganic layer may be disposed on the base layer BL. At least one inorganic layer may constitute a barrier layer and/or a buffer layer. FIG. 1 illustrates the buffer layer BFL disposed on the base layer BL. The buffer layer BFL may improve coupling force between the base layer BL and a semiconductor pattern of the circuit element layer DP-CL.

The circuit element layer DP-CL may be disposed on the buffer layer BFL. The circuit element layer DP-CL may include at least one insulating layer and a circuit element. The circuit element may include a signal line, a driving circuit of a pixel, or the like. The circuit element layer DP-CL may be formed through a process of forming an insulating layer, a semiconductor layer, and a conductive layer by coating or deposition and a process of patterning the insulating layer, the semiconductor layer, and the conductive layer by a photolithography process.

In an embodiment, the circuit element layer DP-CL may include a transistor T1, a connection signal line SCL, connection electrodes CNE1 and CNE2, and a plurality of insulating layers 10 to 60. The plurality of insulating layers 10 to 60 may include first to sixth insulating layers 10 to 60 sequentially stacked on the buffer layer BFL. Each of the first to sixth insulating layers 10 to 60 may include any one of an inorganic layer and an organic layer.

The transistor T1 may include a semiconductor pattern including a source region Sa, an active region Aa, a drain region Da, and a gate electrode Ga. The semiconductor pattern of the transistor T1 may include polysilicon. However, the embodiment of the inventive concept is not limited thereto, and the semiconductor pattern may include amorphous silicon or metal oxide.

The semiconductor pattern may be divided into a plurality of regions according to conductivity. In an embodiment, electrical properties of the semiconductor pattern may vary according to whether the semiconductor pattern is doped, or metal oxide is reduced, for example. A region having relatively high conductivity in the semiconductor pattern may serve as an electrode or a signal line. This may correspond to the source region Sa and the drain region Da of the transistor T1. The non-doped or non-reduced region having relatively low conductivity may correspond to the active region Aa (or a channel region) of the transistor TR.

The connection signal line SCL may be formed from the semiconductor pattern and may be disposed in the same layer as the source region Sa, the active region Aa, and the drain region Da of the transistor T1. In an embodiment, the connection signal line SCL may be electrically connected to the drain region Da of the transistor T1 on a plane.

The first insulating layer 10 may cover the semiconductor pattern of the circuit element layer DP-CL. The gate electrode Ga may be disposed on the first insulating layer 10. The gate electrode Ga may overlap the active region Aa. The gate electrode Ga may function as a mask in a process of doping the semiconductor pattern. An upper electrode UE may be disposed on the second insulating layer 20. The upper electrode UE may overlap the gate electrode Ga.

The first connection electrode CNE1 and the second connection electrode CNE2 may be disposed between the transistor T1 and the light-emitting element OL to electrically connect the transistor T1 to the light-emitting element OL. The first connection electrode CNE1 may be disposed on the third insulating layer 30 and be connected to the connection signal line SCL through a contact hole CNT-1 passing through the first to third insulating layers 10 to 30. The second connection electrode CNE2 may be disposed on the fifth insulating layer 50 and be connected to the first connection electrode CNE1 through a contact hole CNT-2 passing through the fourth and fifth insulating layers 40 and 50.

The display element layer DP-OL may be disposed on the circuit element layer DP-CL. The display element layer DP-OL may include a light-emitting element OL and a pixel defining layer PDL. An emission opening OP-PX may be defined in the pixel defining layer PDL. The light-emitting element OL may include a first electrode AE, a hole transport region HCL, an emission layer EML, an electron transport region ECL, and a second electrode CE.

The first electrode AE and the pixel defining layer PDL may be disposed on the sixth insulating layer 60. The first electrode AE and the pixel defining layer PDL may be disposed on the sixth insulating layer 60. The first electrode AE may be connected to the second connection electrode CNE2 through a contact hole CNT-3 passing through the sixth insulating layer 60. The pixel defining layer PDL may expose the first electrode AE through the emission opening OP-PX. A portion of the first electrode AE exposed by the emission opening OP-PX may correspond to an emission area PXA. A non-emission area NPXA may surround the emission area PXA.

The hole transport region HCL and the electron transport region ECL may be commonly disposed on the emission area PXA and the non-emission area NPXA. The emission layer EML may be patterned to correspond to the emission opening OP-PX. The patterned emission layer EML may be provided by a deposition apparatus ED (refer to FIG. 2).

When compared to the hole transport region HCL and the electron transport region ECL, each of which is provided in the form of a film, the emission layer EML may be deposited in a different manner. The hole transport region HCL and the electron transport region ECL may be commonly formed in the pixels using an open mask. The emission layer EML may be provided differently depending on the pixels using the mask referred to as a fine metal mask ("FMM").

The encapsulation layer TFL may include a plurality of thin films. The encapsulation layer TFL in an embodiment may include first to third thin films EN1, EN2, and EN3, which are sequentially stacked. Each of the first to third thin films EN1, EN2, and EN3 may include any one of an inorganic layer and an organic layer. The inorganic layer may protect the light-emitting element OL against moisture and/or oxygen. The organic layer may protect the light-emitting element OL against foreign substances such as dust particles. However, the configuration of the encapsulation layer TFL is not limited to that illustrated in FIG. 1 as long as the light-emitting element OL is protected or improved in light output efficiency.

Figure 2:
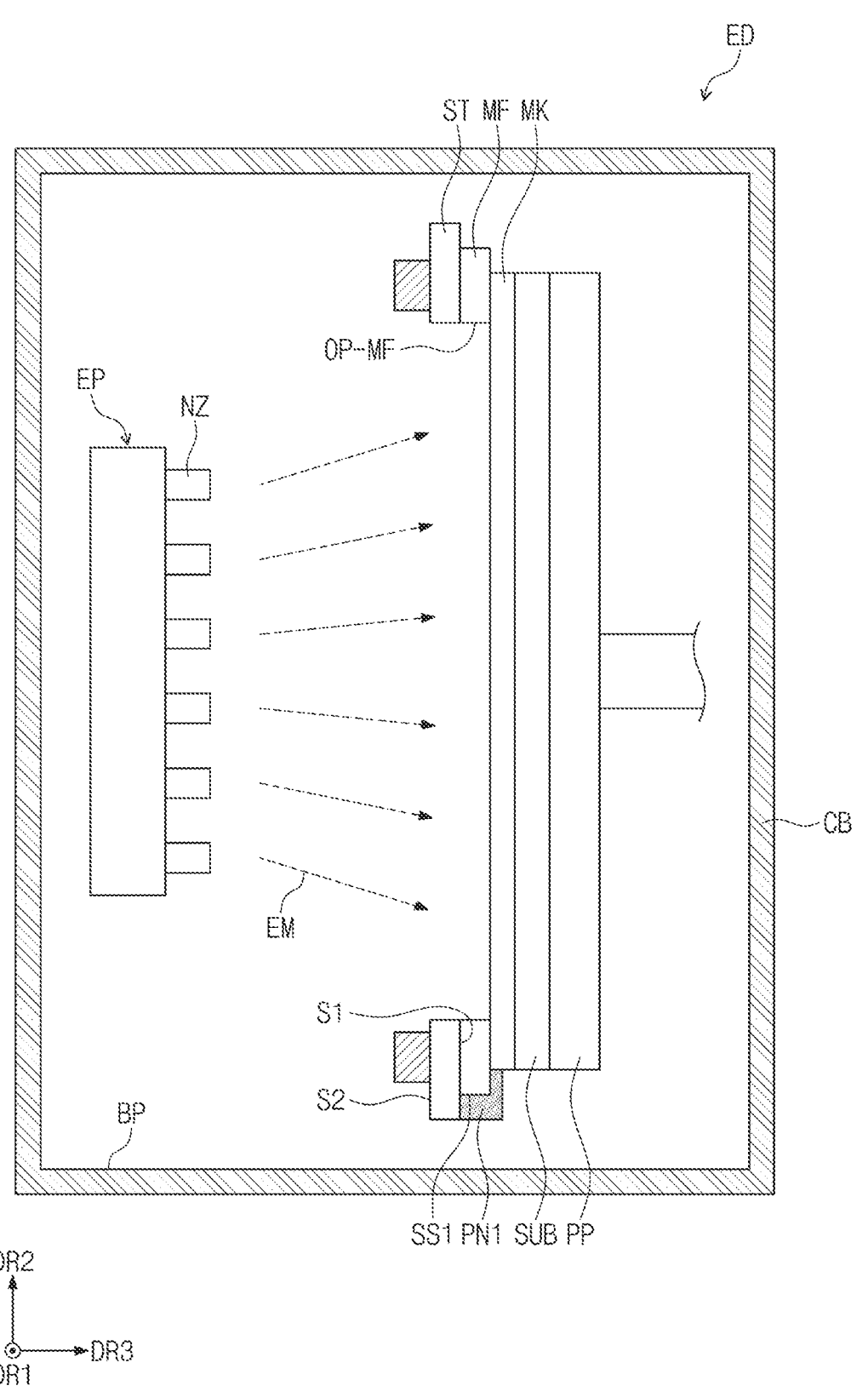
FIG. 2 is a cross-sectional view of an embodiment of a deposition apparatus.

FIG. 2 is a cross-sectional view of an embodiment of the deposition apparatus.

Referring to FIG. 2, the deposition apparatus ED in an embodiment may include a chamber CB, a mask MK, a mask frame MF, a stage ST, and an external force applying part PN1. The deposition apparatus ED may further include an additional mechanical device for implementing an in-line system in addition to the above configuration. In an embodiment, the deposition apparatus ED in an embodiment may further include a deposition member EP and a fixing member PP, for example.

The chamber CB may provide an inner space, and a deposition member EP, a fixing member PP, a mask MK, a mask frame MF, a stage ST, and an external force applying part PN1 may be disposed in the inner space of the chamber CB. The chamber CB may define a sealed space, and a deposition condition may be set to vacuum. The chamber CB may include at least one gate, and the chamber CB may be opened and closed through the gate. The mask MK, the mask frame MF, and the substrate SUB may be accessible through the gate provided in the chamber CB.

The chamber CB may include a bottom surface BP, a ceiling surface, and sidewalls. The bottom surface BP of the chamber CB may be parallel to a plane defined by a first direction DR1 and a third direction DR3, and a normal direction of the bottom surface of the chamber CB may be parallel to the second direction DR2. In this specification, "in a plan view" is set based on a plane parallel to the plane defined by the first direction DR1 and the second direction DR2.

The fixing member PP may be disposed on the deposition member EP inside the chamber CB. The fixing member PP may fix a substrate SUB on the mask MK. The fixing member PP may include a jig or a robot arm that holds the mask MK. The fixing member PP may include magnetic materials through which the mask MK and the substrate SUB are in close contact with to each other. In an embodiment, the magnetic materials may generate magnetic force to fix the mask MK, and the substrate SUB disposed between the mask MK and the fixing member PP may be in close contact with the mask MK, for example.

The substrate SUB may be a processing object on which a deposition material is deposited. The substrate SUB may include a support substrate and a synthetic resin layer disposed on the support substrate. The support substrate may be removed in the latter half of the process of manufacturing of the display panel, and the synthetic resin layer may correspond to the base layer BL of FIG. 1. The substrate SUB may include some components of the display panel DP (refer to FIG. 1) disposed on the base layer BL (refer to FIG. 1) depending on the configuration formed through the deposition process.

The deposition member EP may be disposed inside the chamber CB to face the fixing member PP. The deposition member EP may include a space in which the deposition material EM is accommodated and at least one nozzle NZ. The deposition material EM may include an inorganic material, a metal, or an organic material, which is capable of sublimation or vaporization. In an embodiment, the deposition material EM may include an organic light-emitting material for forming the emission layer EML, for example. However, the deposition material EM is not limited to the above example. The sublimated or vaporized deposition material EM may be injected onto the substrate SUB through the nozzle NZ. The deposition material EM may pass through the mask MK and be deposited on the substrate SUB in a predetermined pattern.

The stage ST may be disposed between the deposition member EP and the fixing member PP. The stage ST may support a rear surface of the mask frame MF and may be disposed outside a moving path of the deposition material EM supplied from the deposition member EP to the substrate SUB.

The stage ST may include a seating surface S1 on which the mask frame MF is seated and a rear surface S2 opposite to the seating surface S1. Each of the seating surface S1 and the rear surface S2 of the stage ST may be parallel to the first direction DR1 and the second direction DR2. The seating surface S1 of the stage ST may be provided substantially perpendicular to the bottom surface BP of the chamber CB. Thus, the area surface of each of the mask frame MF and the mask MK disposed on the seating surface S1 of the stage ST may be provided substantially perpendicular to the bottom surface BP of the chamber so that the deposition process is performed. Thus, the mask MK having a relatively large area may be prevented from be sagged due to gravity to improve deposition reliability.

However, the embodiment of the inventive concept is not limited thereto, and in an embodiment, the seating surface S1 of the stage ST may be provided substantially parallel to the bottom surface BP of the chamber CB, and the rear surface of the mask frame MF and the mask MK may be provided substantially parallel to the bottom surface BP of the chamber CB so that the deposition process is performed.

The mask MK may include deposition openings defining a deposition area. The mask frame MF may be coupled to the mask MK to support the mask MK. The mask frame MF may include a top surface facing the mask MK, a rear surface opposite to the top surface and facing the seating surface S1 of the stage ST, and side surfaces connecting the top surface to the rear surface. An opening OP-MF overlapping the deposition openings of the mask MF may be defined in the mask frame MF. That is, the mask frame MF may have a frame shape surrounding the opening OP-MF in the plan view. This will be described later in detail.

The first external force applying part PN1 may be disposed on the stage ST to support the mask frame MF. The first external force applying part PN1 may be disposed below the stage in the plan view. The first external force applying part PN1 may be disposed so that the mask frame MF faces one side surface SS1 adjacent to the bottom surface BP of the chamber CB. The first external force applying part PN1 may support the mask frame MF and may move in the second direction DR2. As the first external force applying part PN1 moves along the second direction DR2, external force applied to the mask frame MF may be adjusted. A detailed description of the first external force applying part PN1 will be described later.

Figure 3:
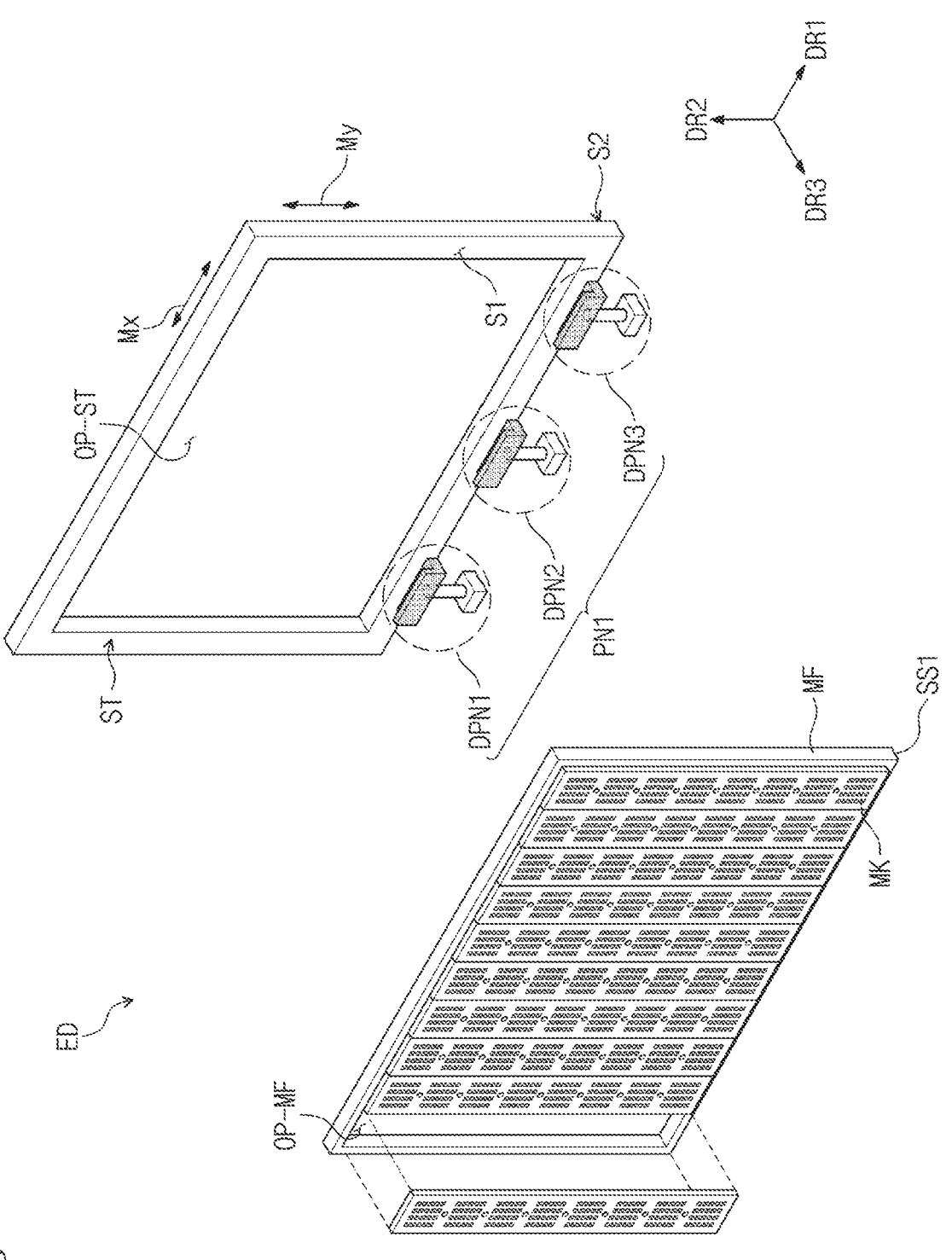
FIG. 3 is an exploded perspective view of an embodiment of a deposition apparatus.
Figure 4:
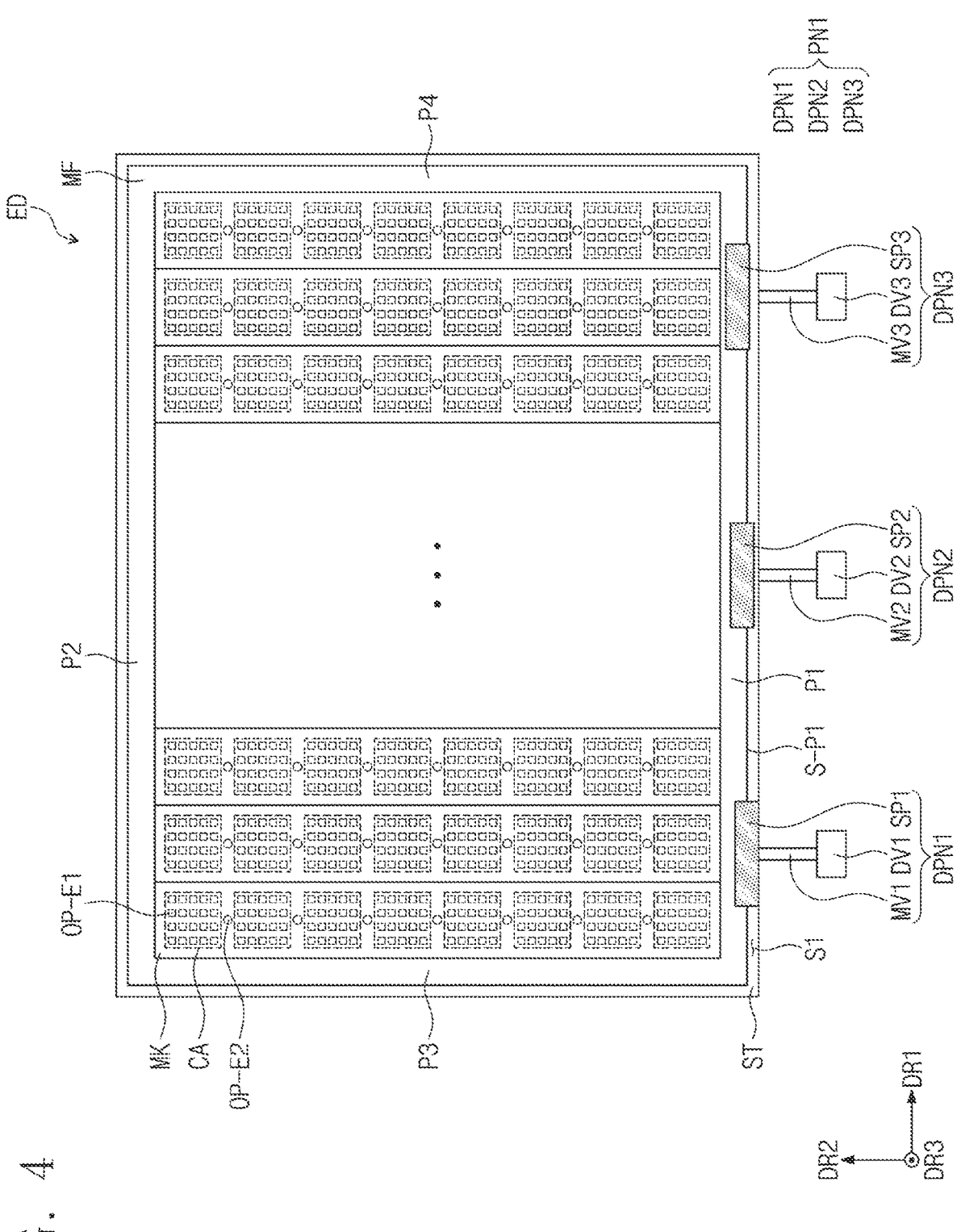
FIG. 4 is a plan view of an embodiment of the deposition apparatus.

FIG. 3 is an exploded perspective view of an embodiment of a deposition apparatus according to the inventive concept. FIG. 4 is a plan view of an embodiment of the deposition apparatus according to the inventive concept. FIG. 4 illustrates a plan view of the deposition apparatus when viewed from the top surface of the mask frame MF. The above description may be equally applied to each of configurations of the deposition apparatus ED illustrated in FIGS. 3 and 4.

Referring to FIGS. 3 and 4, a mask frame MF may provide a support surface on which the mask MK is disposed. The surface on which the mask MK is disposed may correspond to a top surface of the mask frame MF, and a surface opposite to the top surface and facing a seating surface S1 of a stage ST may correspond to a rear surface of the mask frame MF.

The mask frame MF may have predetermined rigidity. In an embodiment, the mask frame MF may include a metal material such as stainless steel (SUS), an Invar alloy, nickel (Ni), or cobalt (Co), for example.

The mask frame MF may have a quadrangular (e.g., rectangular) closed line shape in a plan view. The mask frame MF may include first to fourth portions P1 to P4 defining openings OP-MF. The first to fourth portions P1 to P4 may be integrally provided to surround the opening OP-MF and may provide a single mask frame MF.

Each of the first portion P1 and the second portion P2 may extend in the first direction DR1. Each of the third portion P3 and the fourth portion P4 may extend in the second direction DR2. The first portion P1 and the second portion P2 may face each other. The third portion P3 and the fourth portion P4 may face each other. Each of the third portion P3 and the fourth portion P4 may be disposed between the first portion P1 and the second portion P2.

The first to fourth portions P1, P2, P3, and P4 may include side surfaces S-P1 (refer to FIG. 6), S-P2 (refer to FIG. 6), S-P3 (refer to FIG. 6), and S-P4 (refer to FIG. 6) defining an outer surface of the mask frame MF, respectively. One side surface SS1 of the mask frame MF described above with reference to FIG. 2 may be one of the side surface S-P1, S-P2, S-P3, and S-P4 of the plurality of portions P1, P2, P3, P4, and P4. In this embodiment, the one side surface SS1 is illustrated as corresponding to the side surface S-P1 of the first portion P1, but the embodiment is not necessarily limited thereto.

The mask MK may be provided in plural, and each of the masks MK may be disposed on one mask frame MF. The masks MK may be coupled and fixed on the mask frames MF, respectively. The masks MK may overlap the openings OP-MF of the mask frames MF and may be coupled to each other in a state of being arranged in the first direction DR1.

Each of the masks MK may be a thin plate having a thickness less than that of the mask frame MF. Each of the masks MK may include a metal material such as stainless steel ("SUS"), an Invar alloy, nickel (Ni), cobalt (Co), or the like. However, the material of the masks MK is not limited to the above example.

Each of the masks MK may extend in the second direction DR2. That is, each of the masks MK may have short sides extending along the first direction DR1 and long sides extending along the second direction DR2. However, this is merely one of embodiments, and the extending directions of the masks MK are not limited thereto.

Each of the masks MK may include at least one cell area CA. FIG. 4 illustrates an embodiment in which each of the masks MK includes a plurality of cell areas CA. In one mask MK, the cell areas CA may be spaced apart from each other in the second direction DR2. The cell areas CA of the masks MK arranged along the first direction DR1 may be spaced apart from each other in the first direction DR1. A surface area of one cell area CA may substantially correspond to that of one display panel DP (refer to FIG. 1). The number of cell areas CA illustrated in FIG. 4 may be an illustrative embodiment and may vary depending on the surface area of the mask MK and a surface area of a deposition target and thus is not limited to the drawings.

Deposition openings OP-E1 and OP-E2 may be defined in each of the masks MK. Each of the deposition openings OP-E1 and OP-E2 may be defined to pass in a thickness direction (e.g., a third direction) of the masks MK. The deposition openings OP-E1 and OP-E2 may include first deposition openings OP-E1 defined in the cell area CA of the mask and second deposition openings OP-E2 defined within an area other than the cell area CA of the mask MK.

The first deposition openings OP-E1 defined in each of the cell areas CA may be spaced apart from each other and may have a predetermined arrangement. A shape in which the first deposition openings OP-E1 are arranged may have a quadrangular (e.g., rectangular) shape in the plan view. However, the disclosure is not limited thereto, and the first deposition openings OP-E1 may have a shape such as a rhombus or a circle. The number, shape, and arrangement of the first deposition openings OP-E1 defined in each of the cell areas CA illustrated in FIGS. 3 and 4 may be an illustrative embodiment and may vary depending on the deposition pattern to be formed and thus is not limited to any one example.

The deposition member (also referred to as a deposition material) EP (refer to FIG. 2) passing through the first deposition openings OP-E1 may be deposited on the substrate SUB (refer to FIG. 2) to form a deposition pattern corresponding to the shape and arrangement of the first deposition openings OP-E1. In an embodiment, the deposition pattern may correspond to an emission layer EML (refer to FIG. 1) of a display panel DP (refer to FIG. 1). However, the deposition pattern is not limited to a particular embodiment when it is a layer formed through the deposition in the display panel DP (refer to FIG. 1).

The second deposition openings OP-E2 may be defined between the cell areas CA. Although FIG. 4 illustrates that second deposition openings OP-E2 are defined in areas between cell areas CA spaced apart along the second direction DR2, the disclosure is not limited thereto. In an embodiment, the second deposition openings OP-E2 may not be disposed between the cell areas CA, for example, but may be disposed only at a portion or may be disposed adjacent to an edge of the cell areas CA.

The deposition material EP (refer to FIG. 2) passing through the second deposition openings OP-E2 may be deposited on the substrate SUB (refer to FIG. 2) to form an alignment pattern corresponding to the shape and arrangement of the second deposition openings OP-E2. The alignment pattern may be used to verify accuracy of the deposition pattern formation position. Whether the deposition pattern is disposed within the specification may be predicated using the formation position of the alignment pattern. In addition, the mask frame MF may be realigned on the stage ST by the formation position of the alignment pattern.

The stage ST may include a seating surface S1 on which the mask frame MF is seated and a rear surface S2 opposite to the seating surface S1. The seating surface S1 of the stage ST may support a rear surface of the mask frame MF. The stage ST may have a shape corresponding to the shape of the mask frame MF. In an embodiment, the stage ST may have a frame shape defining a stage opening OP-ST overlapping the opening OP-MF of the mask frame MF, for example. In FIG. 3, the stage ST having a quadrangular ring shape including long sides extending along the first direction DR1 and short sides extending along the second direction DR2 on the plan view is illustrated as an example. However, this is merely one of embodiments, and the disclosure is not limited thereto, and the shape of the stage ST is not limited to any one as long as the stage ST supports the rear surface of the mask frame MF.

The first external force applying part PN1 may include a plurality of first sub external force applying parts DPN1, DPN2, and DPN3. FIGS. 3 and 4 illustrates that the number of first sub external force applying parts DPN1, DPN2, and DPN3 is three, the disclosure is not limited thereto. In an embodiment, the number of first sub external force applying parts DPN1, DPN2, and DPN3 provided in the deposition apparatus ED may be less than or more than three, for example.

Each of the first sub external force applying parts DPN1, DPN2, and DPN3 may be connected to the stage ST. Each of the first sub external force applying parts DPN1, DPN2, and DPN3 may be disposed below the stage ST on the seating surface S1 of the stage ST and may be disposed adjacent to one side of the stage ST parallel to the first direction DR1. The first sub external force applying parts DPN1, DPN2, and DPN3 may be spaced apart from each other in the first direction DR1.

Each of the first sub external force applying parts DPN1, DPN2, and DPN3 may independently move in a direction parallel to the second direction DR2. A moving direction of the first sub external force applying parts DPN1, DPN2, and DPN3 is defined as a vertical direction My perpendicular to a horizontal direction Mx. Each of the first sub external force applying parts DPN1, DPN2, and DPN3 may move in the vertical direction My and may control external force applied to the side surface 5-P1 of the first portion P1.

Each of the first sub external force applying parts DPN1, DPN2, and DPN3 may include supports SP1, SP2, and SP3, moving parts MV1, MV2, and MV3, and driving parts DV1, DV2, and DV3. The supports SP1, SP2, and SP3 may support a side surface (also referred to as an outer surface) 5-P1 of the first portion P1. The moving parts MV1, MV2, and MV3 may be members connecting the supports SP1, SP2, and SP3 to the driving parts DV1, DV2, and DV3. The driving parts DV1, DV2, and DV3 may move the moving parts MV1, MV2, and MV3 and the supports SP1, SP2, and SP3 connected to the moving parts MV1, MV2, and MV3 in the vertical direction My. That is, the first sub external force applying parts DPN1, DPN2, and DPN3 may include the driving parts DV1, DV2, and DV3 so as to be actively operate without applying separate external force, respectively. In an embodiment, each of the driving parts DV1, DV2, and DV3 may be an electric motor or a piezoelectric element, for example. However, this is merely one of embodiments, and the type of the driving part is not limited thereto as long as the support and the moving part are movable in the vertical direction. In FIG. 4, the driving parts DV1, DV2, and DV3 and the moving parts MV1, MV2, and MV3 are respectively illustrated as separate configurations, but the disclosure is not limited thereto, and the driving parts DV1, DV2, and DV3 and the moving part MV1, MV2, and MV3 may be one configuration.

The driving parts DV1, DV2, and DV3 of each of the first sub external force applying parts DPN1, DPN2, and DPN3 may independently move the supports SP1, SP2, and SP3 in the vertical direction My, respectively. The first sub external force applying parts DPN1, DPN2, and DPN3 may apply external force to the mask frame MF in a direction parallel to the second direction DR2. Thus, each of the first sub external force applying parts DPN1, DPN2, and DPN3 may independently compensate for deformation of the mask frame MF due to intrinsic tension of the mask frame MF.

Although the shapes of the first sub external force applying parts DPN1, DPN2, and DPN3 are briefly illustrated in FIGS. 3 and 4, the mask frame MF may support one side surface SS1, and the shapes of the first sub external force applying parts DPN1, DPN2, and DPN3 are not limited thereto when the position of each of the first sub external force applying parts DPN1, DPN2, and DPN3 is adjustable.

Figure 5A:
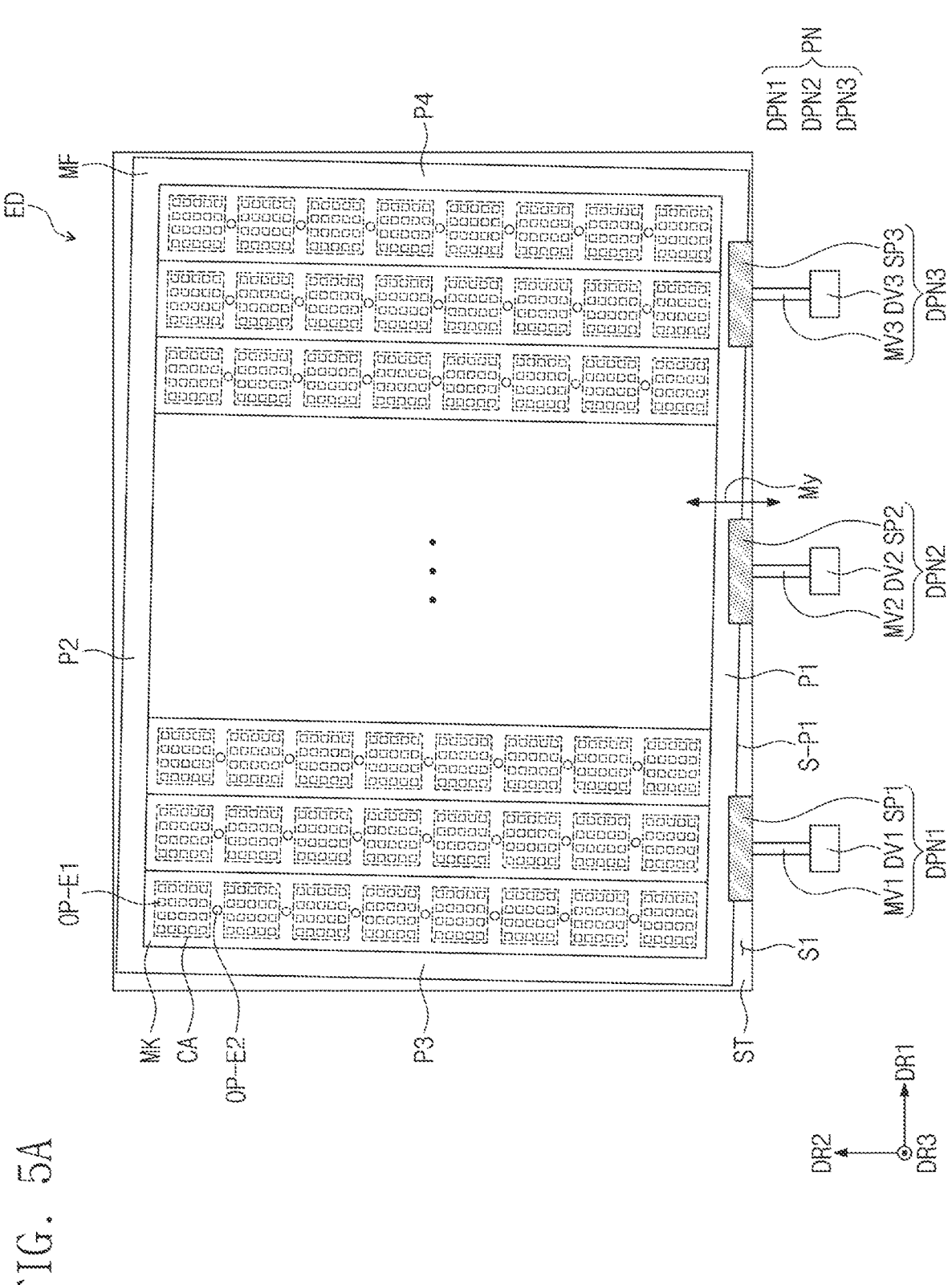
FIG. 5A is a plan view of an embodiment of a deposition apparatus.
Figure 5B:
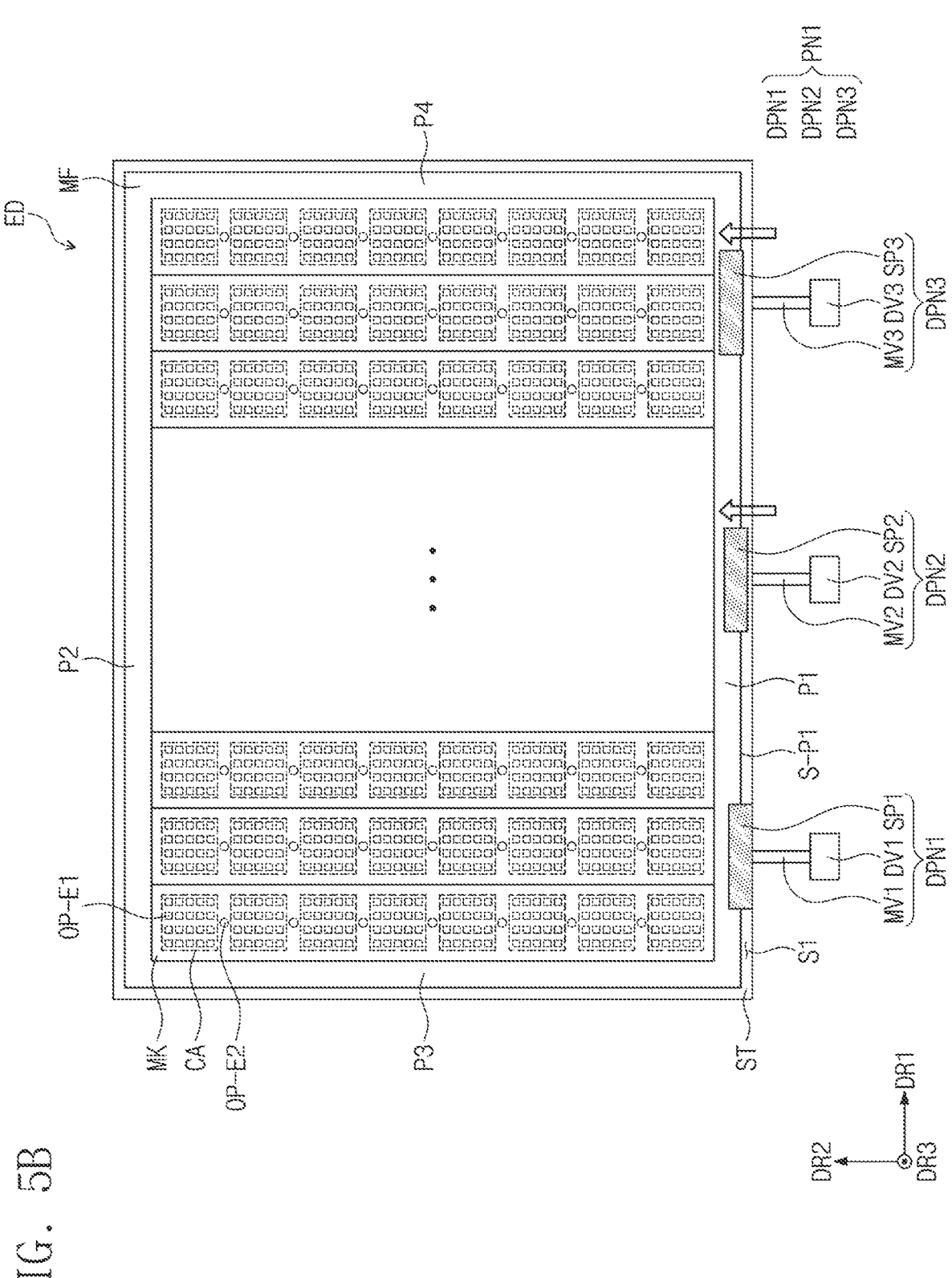
FIG. 5B is a plan view of an embodiment of the deposition apparatus.
Figure 5C:
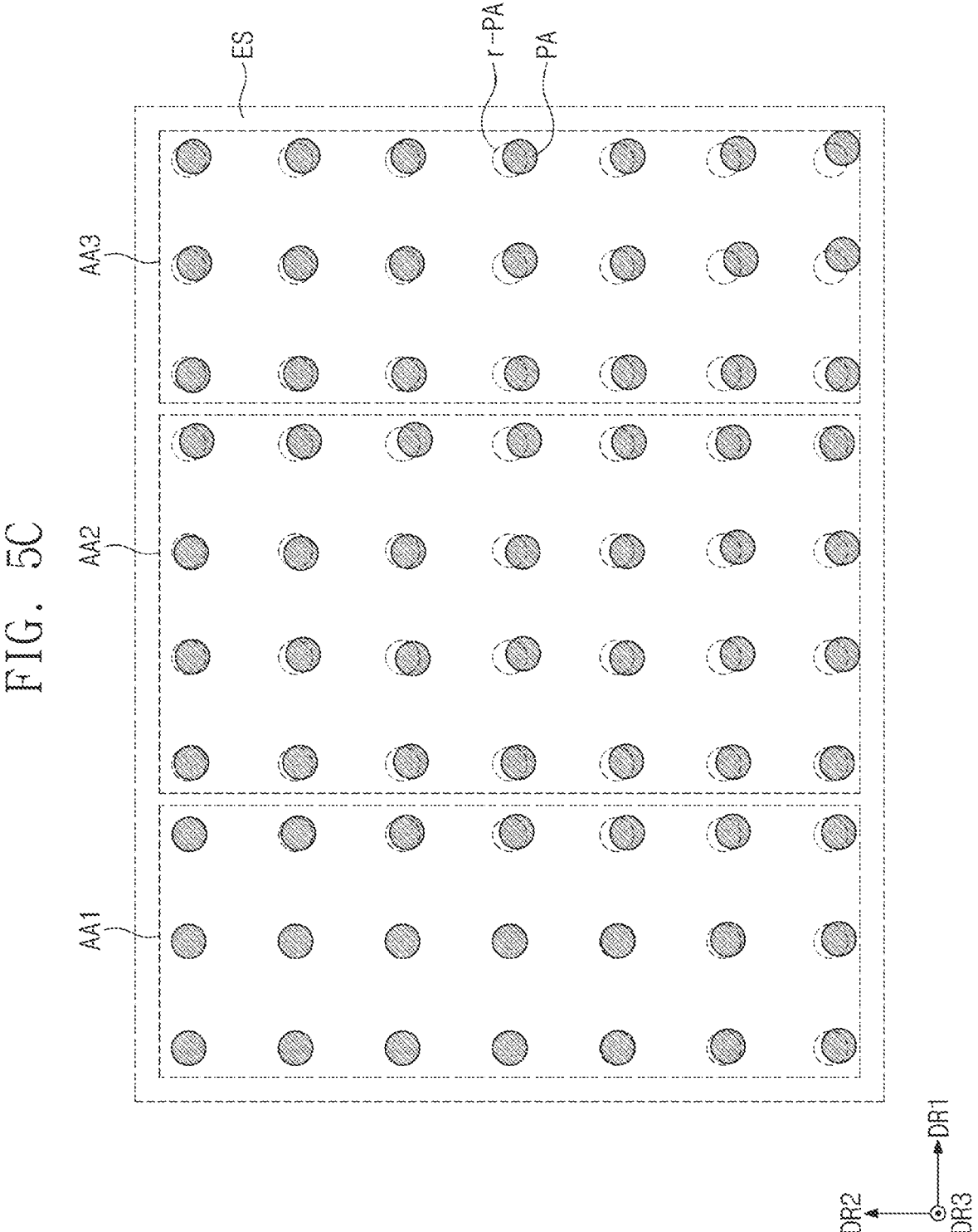
FIG. 5C is a plan view of an embodiment of a deposition surface on which alignment patterns are disposed.

FIGS. 5A and 5B are plan views of a deposition apparatus. FIG. 5C is a plan view of a deposition surface on which alignment patterns are disposed. FIGS. 5A and 5B are schematic plan views illustrating some configurations of the deposition apparatus ED when viewed from a seating surface S1 of a stage ST. With respect to each configuration illustrated in FIGS. 5A to 5C, the above description may be applied in the same manner, and overlapping descriptions will be omitted below. Referring to FIGS. 5A to 5C, in a process of seating a mask frame MF to which a mask MK is coupled on the stage ST, the mask frame MF may be seated at an incorrect position. In an alternative embodiment, a shape of the mask frame MF may be deformed due to intrinsic tension of the mask frame MF. When the mask frame MF is not seated at the accurate position, deposition accuracy may be deteriorated. In FIG. 5A, the state in which the mask frame MF is seated on the stage ST is merely one of embodiments, and the mask frame MF may be seated on the stage ST in other forms.

First sub external force applying parts DPN1, DPN2, and DPN3 may move independently of each other in the vertical direction My. Each of the first sub external force applying parts DPN1, DPN2, and DPN3 may move to control external force applied to a side surface 5-P1 of a first portion P1 according to a support area.

The positions of the first sub external force applying parts DPN1, DPN2, and DPN3 may be adjusted according to a degree to which the mask frame MF is twisted in a plan view. Referring to FIG. 5B, the position of the mask frame MF may be adjusted by moving some of the first sub external force applying parts DPN1, DPN2, and DPN3 toward the side surface 5-P1 of the first portion P1. As a result, the mask frame MF twisted in the plan view as illustrated in FIG. 5A may be adjusted to be aligned in the plan view as illustrated in FIG. 4B.

In FIG. 5C, a deposition surface ES may be a surface on which the deposition pattern is disposed. The deposition surface ES may correspond to one surface of a substrate SUB (refer to FIG. 2) to be processed. Alignment patterns PA capable of predicting a formation position of the deposition pattern may be disposed on the deposition surface ES. The alignment patterns PA may correspond to second deposition openings OP-E2 of the mask MK. In FIG. 5C, for convenience of description, the deposition patterns is omitted, and alignment patterns PA are exaggerated.

Uniformity and deposition tendency of the deposition pattern may be predicted using the alignment patterns PA disposed on the deposition surface ES. As a result, at least one of the external force applying parts PN1 provided in the deposition apparatus ED may be controlled to apply the external force to a predetermined area of the mask frame MF, and thus, the accuracy of the formation position of the deposition pattern may be improved.

An embodiment in which the deposition accuracy of the alignment patterns PA is relatively low in the lower portions of the second area AA2 and the third area AA3 is illustrated. Also, it is seen that the alignment patterns PA disposed under the second area AA2 and the third area AA3 tend to be disposed below a reference alignment areas r-PA.

To improve the deposition accuracy, as illustrated in FIG. 5A, the first sub external force applying parts DPN2 and DPN3 corresponding to the lower portions of the second and third areas AA2 and AA3 may move in the second direction DR2. Thus, the external force applied to a central portion and a right portion of the side surface S-P1 of the first portion P1 by each of the first sub external force applying parts DPN2 and DPN3 corresponding to the lower portions of the second area AA2 and the third area AA3 may increase. As a result, a degree to which the alignment patterns PA are non-uniformly disposed in the first direction DR1 and the second direction DR2 may be reduced. As the number of external force applying parts disposed along the extending direction of the mask frame MF increases, the external force applied to the mask frame MF may be finely adjusted according to the areas, and thus, the deposition accuracy may be more effectively improved.

As described above, the seating position of the mask frame MF may be adjusted by adjusting the position of each of the first sub external force applying parts DPN1, DPN2, and DPN3, and the position of the mask MK coupled to the mask frame MF may also be adjusted. The positions of the mask frame MF and the mask MF may be adjusted to improve the deposition accuracy. In addition, the positions of the first sub external force applying parts DPN1, DPN2, and DPN3 may be independently adjusted to precisely control the seating position of the mask frame MF.

The misaligned direction of the mask frame MF described with reference to FIGS. 5A to 5C and the number and direction of the external force applying parts PN1 controlled for adjusting the mask frame MF are merely some of embodiments, and thus, the disclosure is not limited thereto. The number and direction of the external force applying parts PN1 controlled according to the direction and degree of distortion of the mask frame MF may be changed.

Figure 6:
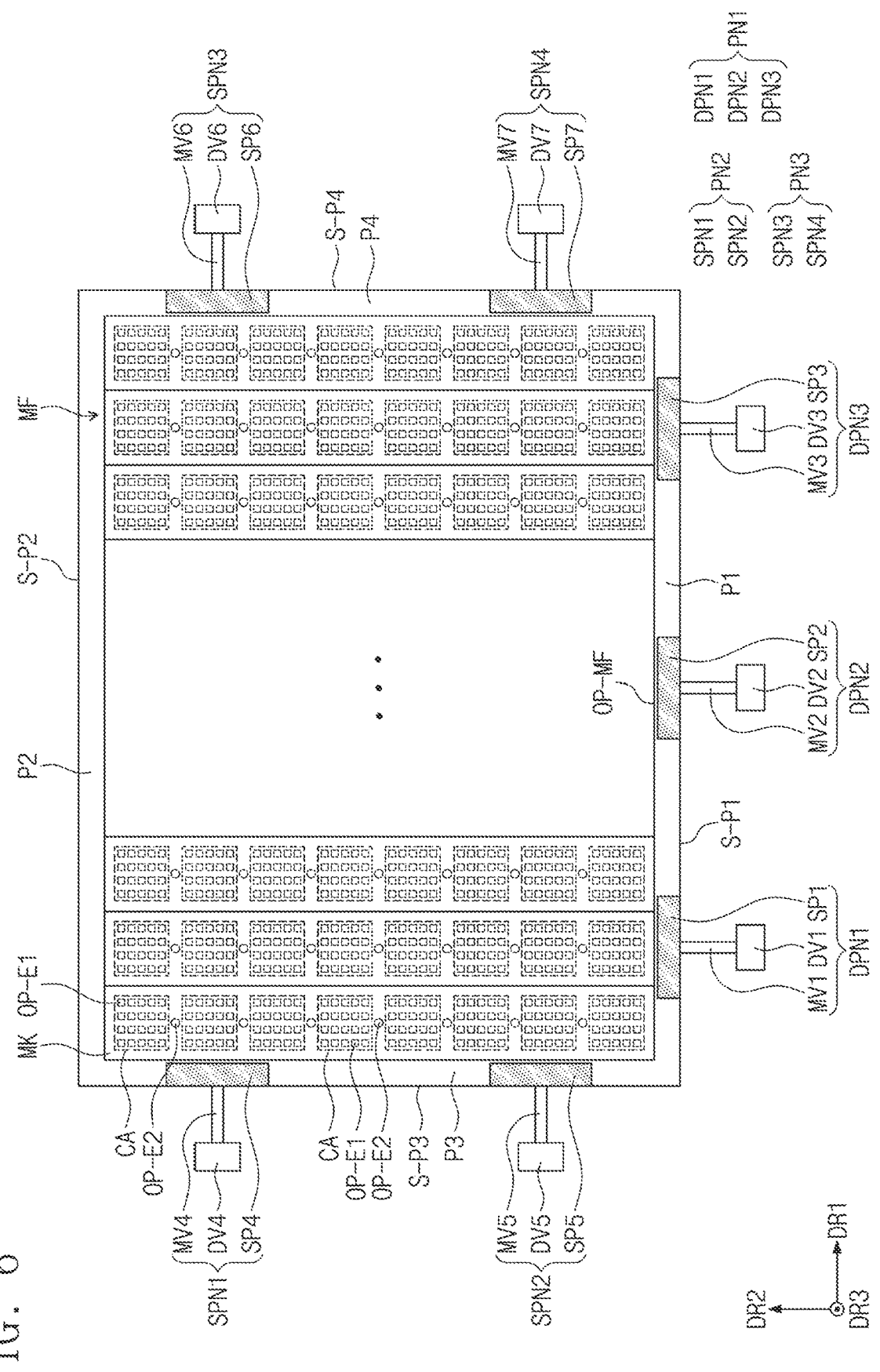
FIG. 6 is a plan view of an embodiment of a deposition apparatus.
Figure 7A:
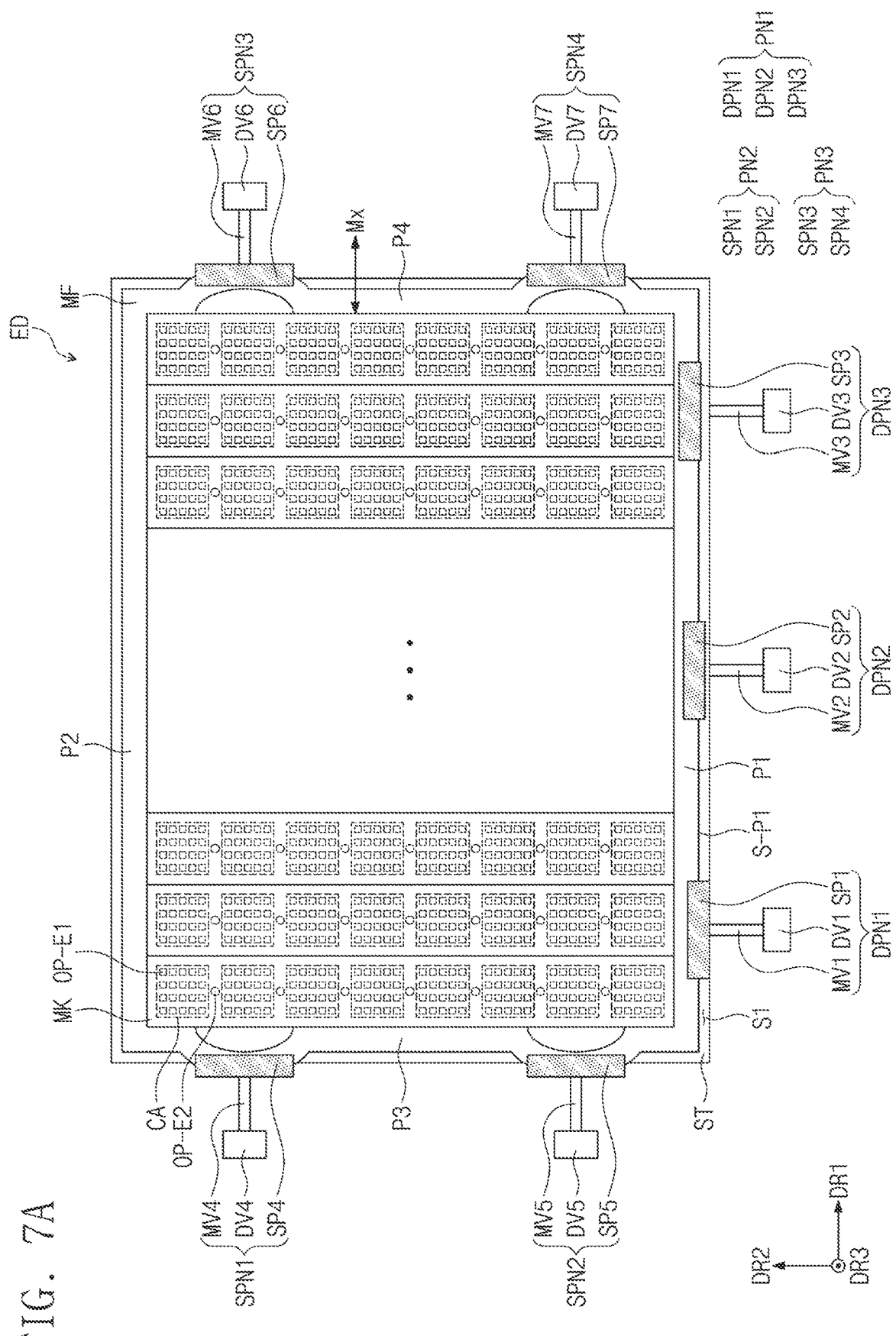
FIG. 7A is a plan view of an embodiment of the deposition apparatus.
Figure 7B:
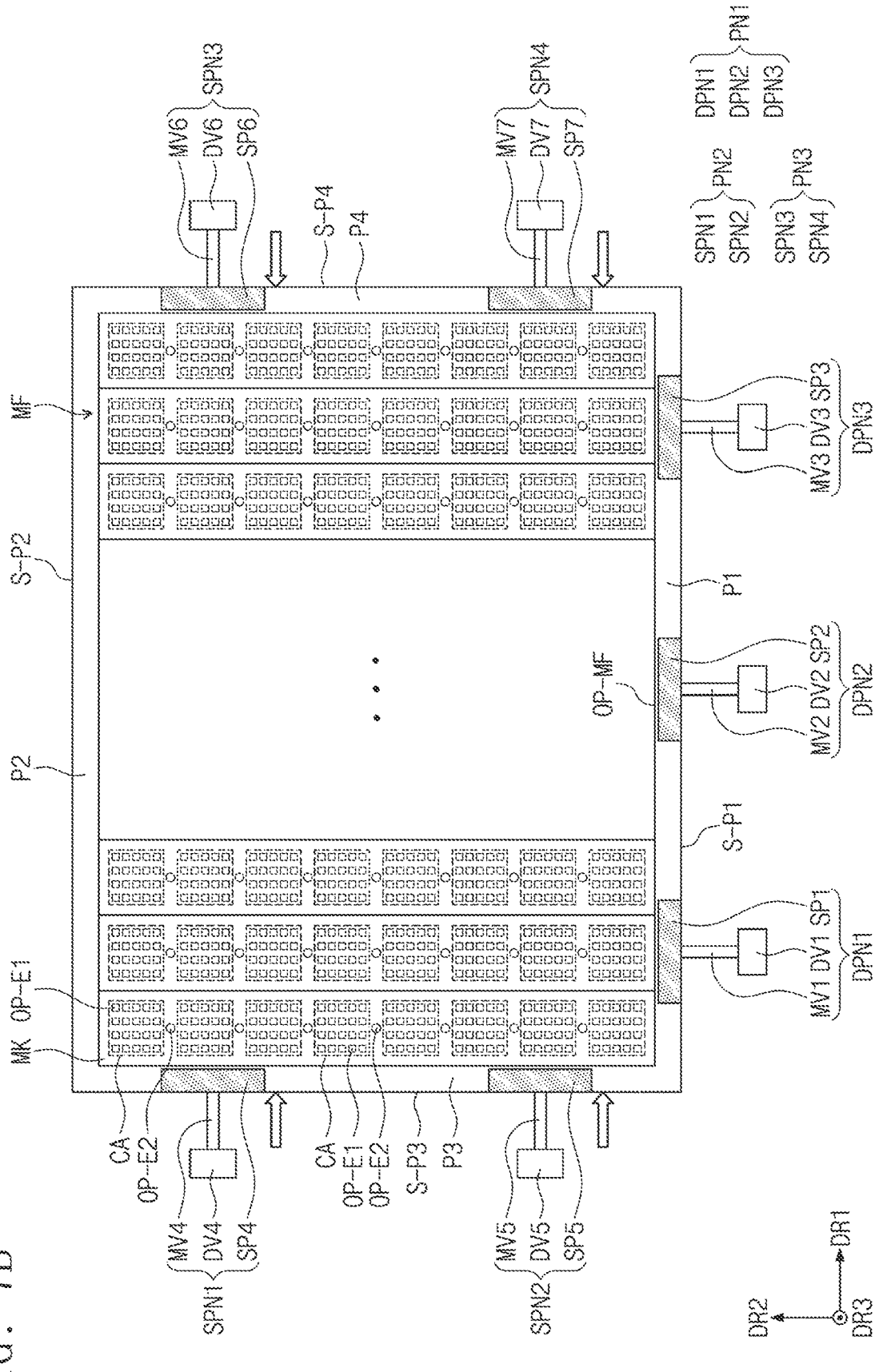
FIG. 7B is a plan view of an embodiment of the deposition apparatus.

FIGS. 6, 7A, and 7B are plan views of a deposition apparatus. FIGS. 7A and 7B schematically illustrate plan views of a partial configuration of the deposition apparatus ED when viewed from a seating surface S1 of a stage ST. The above description may be equally applied to each configuration illustrated in FIGS. 6A and 6B, and overlapping descriptions will be omitted below.

Referring to FIG. 6, the deposition apparatus ED in an embodiment may further include a second external force applying part PN2 and a third external force applying part PN3, unlike the deposition apparatus illustrated in FIGS. 4 to 5B. The second external force applying part PN2 may be disposed adjacent to a third portion P3 of a mask frame MF. The third external force applying part PN3 may be disposed adjacent to a fourth portion P4 of the mask frame MF. The second external force applying part PN2 and the third external force applying part PN3 may face each other on the mask frame MF.

The second external force applying part PN2 may include a plurality of second sub external force applying parts SPN1 and SPN2. The second sub external force applying parts SPN1 and SPN2 may be spaced apart from one side of the third portion P3, which is adjacent to the first portion P1, and an opposite side of the third portion P3, which is adjacent to the second portion P3. Although FIG. 6 illustrates that the number of second sub external force applying parts SPN1 and SPN2 is two, this is merely one of embodiments, and the positions and number of the second sub external force applying parts SPN1 and SPN2 are not limited thereto.

The second external force applying part PN2 may move in a direction parallel to the first direction DR1 corresponding to the horizontal direction Mx. The second sub external force applying parts SPN1 and SPN2 may independently move in the direction parallel to the first direction DR1. Thus, the second sub external force applying parts SPN1 and SPN2 may control external force applied to the outside S-P3 of the third portion P3 of the mask frame MF.

The second sub external force applying parts SPN1 and SPN2 may include second driving parts DV4 and DV5, second supports SP4 and SP5, and second moving parts MV4 and MV5, respectively. Each of the second supports SP4 and SP5 may support the outside S-P3 of the third portion P3. The second driving parts DV4 and DV5 may move the second supports SP4 and SP5 and the second moving parts MV4 and MV5 in the direction parallel to the first direction DR1, respectively.

The third external force applying part PN3 may include a plurality of third sub external force applying parts SPN3 and SPN4. The third sub external force applying parts SPN3 and SPN4 may be spaced apart from one side of the fourth portion P4, which is adjacent to the first portion P1, and an opposite side of the fourth portion P4, which is adjacent to the second portion P2. Although FIG. 6 illustrates that the number of third sub external force applying parts SPN3 and SPN4 is two, this is merely one of embodiments, and the positions and number of the third sub external force applying parts SPN3 and SPN4 are not limited thereto.

The third external force applying part PN3 may move in a direction parallel to the first direction DR1. The third sub external force applying parts SPN3 and SPN4 may independently move in the direction parallel to the first direction DR1. Thus, the third sub external force applying parts SPN3 and SPN4 may control external force applied to the outside S-P4 of the fourth portion P4 of the mask frame MF.

The third sub external force applying parts SPN3 and SPN4 may include third driving parts DV6 and DV7, third supports SP6 and SP7, and third moving parts MV6 and MV7, respectively. Each of the third supports SP6 and SP7 may support the outside S-P4 of the fourth portion P4. The third driving parts DV6 and DV7 may move the third supports SP6 and SP7 and the third moving parts MV6 and MV7 in the direction parallel to the first direction DR1, respectively.

Referring to FIGS. 7A and 7B, in the mask frame MF in an embodiment, twisting and bending may occur at the third portion P3 and the fourth portion P4 due to intrinsic tension of the mask frame MF. A second attractive force applying part PN2 may move in the first direction DR1 to apply external force in the first direction DR1 to the outside S-P3 of the third portion P3, thereby controlling the shape of the mask frame MF. That is, the deposition apparatus ED in an embodiment may include the second attractive force applying part PN2 to compensate for deformation of the mask frame MF due to distortion and bending occurring in the third portion P3.

The third attractive force applying part PN3 may move in the first direction DR1 to apply external force in the first direction DR1 to the outer side S-P4 of the fourth portion P4, thereby controlling the shape of the mask frame MF. That is, the deposition apparatus ED in an embodiment includes the second attractive force applying part PN2 to compensate for deformation of the mask frame MF due to distortion and bending occurring in the fourth portion P4.

The deposition apparatus in an embodiment may include an external force applying part disposed at one side of a stage and capable of adjusting a position of the mask frame disposed on the stage. The external force applying part may include the driving part to adjust the position of the mask frame in real time. Therefore, the deposition apparatus in an embodiment may have improved deposition accuracy, and thus, process efficiency may be improved.

The deposition apparatus in the embodiment of the inventive concept may include the external force applying part that aligns the positions of the mask and the mask frame to improve the deposition accuracy, and the mask having the reduced deposition accuracy may be replaced to reduce the deposition process cost.

In the deposition apparatus in the embodiment of the inventive concept, the seating surface may be vertically provided in the chamber to prevent the mask from being sagged, thereby improving the deposition reliability and enabling the large-area deposition.

It will be apparent to those skilled in the art that various modifications and deviations may be made in the invention. Thus, it is intended that the invention covers the modifications and deviations of this invention provided they come within the scope of the appended claims and their equivalents. Accordingly, the technical scope of the invention should not be limited to the contents described in the detailed description of the specification, but should be determined by the claims.

What is claimed is:

1. A deposition apparatus comprising:
a mask in which a plurality of deposition openings are defined;
a mask frame which comprises first to fourth portions and is disposed on a rear surface of the mask and in which an opening is defined;
a stage disposed on a rear surface of the mask frame; and
first to third external force applying parts disposed on the stage,
wherein each of the first portion and the second portion extends in a first direction, and each of the third portion and the fourth portion extends in a second direction perpendicular to the first direction,
the first external force applying part comprises a first support which supports an outer surface of the first portion and a first driving part which moves the first support in the second direction,
the second external force applying part comprises a second support which supports to an outer surface of the third portion and a second driving part which moves the second support in the first direction, and
the third external force applying part comprises a third support which supports an outer surface of the fourth portion and a third driving part which moves the third support in the first direction.

2. The deposition apparatus of claim 1, wherein the first external force applying part comprises a plurality of first sub external force applying parts spaced apart from each other in the first direction,
the second external force applying part comprises a plurality of second sub external force applying parts spaced apart from each other in the second direction, and
the third external force applying part comprises a plurality of third sub external force applying parts spaced apart from each other in the second direction.

3. The deposition apparatus of claim 2, wherein each of the plurality of first sub external force applying parts is independently movable in the second direction,
each of the plurality of second sub external force applying parts is independently movable in the first direction, and
each of the plurality of third sub external force applying parts is independently movable in the first direction.

4. The deposition apparatus of claim 2, wherein the plurality of second sub external force applying parts is spaced apart from each other at one side of the third portion, which is adjacent to the first portion, and an opposite side of the third portion, which is adjacent to the second portion, and
the plurality of third sub external force applying parts is spaced apart from each other at one side of the fourth portion, which is adjacent to the first portion, and an opposite side of the fourth portion, which is adjacent to the second portion.

5. The deposition apparatus of claim 1, wherein at least one of the first to third driving parts comprises an electric motor or a piezoelectric element.

6. The deposition apparatus of claim 1, further comprising a chamber in which an inner space, in which the mask, the mask frame, the stage, and the first to third external force applying parts are disposed, is defined, and
the first portion is disposed face a bottom surface of the chamber.

7. The deposition apparatus of claim 6, further comprising a deposition member which faces a rear surface of the stage in the inner space and injects a deposition material onto the mask.

8. The deposition apparatus of claim 1, wherein each of the mask and the mask frame comprises a metal.

9. A deposition apparatus comprising:
a chamber in which an inner space is defined;
a stage which provides a seating surface which is perpendicular to a bottom surface of the chamber;
a mask frame is disposed on the seating surface, and comprising:
a first portion in which an opening is defined, and which extends in a first direction parallel to the bottom surface and is adjacent to the seating surface;
a second portion facing the first portion and extending in the first direction;

a third portion extending in a second direction parallel to the seating surface and disposed between the first portion and the second portion; and a fourth portion facing the third portion and extending in the second direction;

a mask in which a deposition opening is defined and which overlaps the opening on the mask frame; and a first external force applying part comprising a first support which supports an outer surface of the first portion and a first driving part which moves the first support in the second direction.

10. The deposition apparatus of claim 9, wherein the first external force applying part comprises a plurality of first sub external force applying parts spaced apart from each other in the first direction on the first portion.

11. The deposition apparatus of claim 10, wherein each of the plurality of first sub external force applying parts is independently movable in the second direction.

12. The deposition apparatus of claim 9, wherein the first driving part comprises an electric motor or a piezoelectric element.

13. The deposition apparatus of claim 9, further comprising:

a second external force applying part disposed on an outer surface of the third portion and comprising a second support and a second driving part which moves the second support in the first direction; and a third external force applying part disposed on an outer surface of the fourth portion and comprising a third support and a third driving part which moves the third support in the first direction.

14. The deposition apparatus of claim 13, wherein the second external force applying part comprises a plurality of second sub external force applying parts, and the third external force applying part comprises a plurality of third sub external force applying parts.

15. The deposition apparatus of claim 14, wherein each of the plurality of second sub external force applying parts is independently movable in the first direction, and each of the plurality of third sub external force applying parts is independently movable in the first direction.

16. The deposition apparatus of claim 15, wherein the plurality of second sub external force applying parts and the plurality of third sub external force applying parts one-to-one correspond to each other in the first direction.

17. The deposition apparatus of claim 14, wherein the plurality of second sub external force applying parts is spaced apart from each other at one side of the third portion, which is adjacent to the first portion, and an opposite side of the third portion, which is adjacent to the second portion, and the plurality of third sub external force applying parts is spaced apart from each other at one side of the fourth portion, which is adjacent to the first portion, and an opposite side of the fourth portion, which is adjacent to the second portion.

18. The deposition apparatus of claim 9, wherein each of the mask and the mask frame comprises a metal.

19. The deposition apparatus of claim 9, further comprising a deposition member which faces a rear surface of the stage in the inner space and injects a deposition material onto the mask.

20. A deposition method comprising:

providing a stage providing a seating surface and first to third external force applying parts disposed on the stage;

providing a mask frame comprising first to fourth portions on the seating surface and a mask which is coupled to the mask frame and in which deposition openings are defined;

simulate a formation position of each of deposition patterns which respectively correspond to the deposition openings; and moving at least one of the first to third external force applying parts so that the formation position of each of the deposition patterns is disposed within a design range to adjust force applied to the mask frame, wherein each of the first portion and the second portion extends in a first direction, and each of the third portion and the fourth portion extends in a second direction perpendicular to the first direction, the first external force applying part comprises a first support supporting an outer surface of the first portion and a first driving part moving the first support in the second direction, the second external force applying part comprises a second support supporting an outer surface of the third portion and a second driving part moving the second support in the first direction, and the third external force applying part comprises a third support supporting an outer surface of the fourth portion and a third driving part moving the third support in the first direction.

* * * * *